US008246356B2

(12) United States Patent
Vanderelli

(10) Patent No.: US 8,246,356 B2
(45) Date of Patent: Aug. 21, 2012

(54) MAGNETIC FLUX VIEWER

(76) Inventor: Timm A. Vanderelli, Ligonier, PA (US)

( * ) Notice: Subject to any disclaimer, the term of this patent is extended or adjusted under 35 U.S.C. 154(b) by 1370 days.

(21) Appl. No.: 11/734,561

(22) Filed: Apr. 12, 2007

(65) Prior Publication Data

US 2007/0241745 A1  Oct. 18, 2007

Related U.S. Application Data

(60) Provisional application No. 60/744,801, filed on Apr. 13, 2006.

(51) Int. Cl.
*G09B 23/18* (2006.01)
*G09B 23/06* (2006.01)
*G09B 23/00* (2006.01)

(52) U.S. Cl. ......... 434/301; 434/276; 434/300; 434/409

(58) Field of Classification Search .................. 434/301
See application file for complete search history.

(56) References Cited

U.S. PATENT DOCUMENTS

| | | | |
|---|---|---|---|
| 3,648,269 A | | 3/1972 | Rosenweig |
| 3,876,288 A | * | 4/1975 | Iwata et al. .................. 359/296 |
| 3,924,852 A | * | 12/1975 | Tamol ............................ 434/258 |
| 3,972,595 A | | 8/1976 | Romankiw |
| 4,267,509 A | | 5/1981 | Graham |
| 2006/0152804 A1 | | 7/2006 | Bove |

OTHER PUBLICATIONS

Yamane, et al., Glass for Photonics, ISBN 0521580566, Published 2000 (abstract).

Borra, F. et al., Large Magnetic Liquid Mirrors, Astronomy and Astrophysics Manuscript No. AA3880-05, Univ. Laval, Quebec, Canada, Sep. 29, 2005 (abstract).
Cheng, G. et al., Magnetic-Field-Induced Assemblies of Cobalt Nanoparticles, Nat'l Inst. of Standards, Oct. 20, 2005.
Ngo, A.T. et al., Organization and Magnetic Properties of Cigar-Shaped Ferrite Nanocrystals, Univ. Pierre et Marie Curie, New Journal of Physics 4 (2002): 87.1-87.8.
Butter, K. et al., Direct Observation of Dipolar Chains in Iron Ferrofluids by Cryogenic Electron Microscopy, Utrecht Univ., Netherlands, Dept. of Path., Jan. 12, 2003.
Lacoste, D. et al., Phase Transitions in a Ferrofluid at Magnetic-Field-Inducted Microphase Separation, Phy. Review E vol. 64, 2001 (abstract).
Ladd, A.J.C. et al., Lattice-Boltzmann Simulations of Particle-Fluid Suspensions, J. of Stat. Physics vol. 104(5-6), Sep. 2001 (abstract).
Shibli, S.M. et al., The Effet of Ferrofluid Magnetic Particle Concentration on the Thermal Diffusivity, Brazilian J. of Physics vol. 31(3), Sep. 2001.
Skomski, R., Nanomagnetics, Univ. of Nebraska, Journal of Physics, Condensed Matter 15: R841-R896, 2003 (abstract).
Prausnitz, J.M., Thermodynamics of Structured Fluids, Hard Science on Soft Materials, Pure Appl. Chem vol. 71(10): 1819-1834, 2000.
Rosensweig, R.E., Superparamagnetic Effect in Ferrofluid, Ferrohydrodynamics, p. 61-63, 1985.

(Continued)

*Primary Examiner* — Nikolai A Gishnock

(57) ABSTRACT

In an embodiment, the claimed invention is a device to for optical presentation of magnetic flux. A ferromagnetic colloidal mixture is substantially evenly dispersed and sealed between two optically transmissive lenses. At least one magnetic source is juxtaposed about the viewer. A light source is positioned to project through the mixture, the light interacting with the mixture to create the presentation of magnetic flux. The viewer is optionally positioned within a housing. In another embodiment, the invention is a method of using the viewer to view a presentation of magnetic flux when light interacts with the mixture.

6 Claims, 4 Drawing Sheets

OTHER PUBLICATIONS

Bal, M. et al., Non-Equilibrium Magnetization Dynamics in the Fe Single Magnetic Induced by High-Intensity Microwave Radiation, Euro. Lett. 71(1): 110-116, 2005 (abstract).

Snyder, Michael Monroe: Photonic mapping of magnetic fields by means of a Ferrofluid Hele-Shaw cell. Apr. 2010. Thesis for Master of Science Degree, Department of Physics and Astronomy, University of Louisville, Louisville, Kentucky. Relevant reference p. 6, (B) Background and layout. Entire thesis written based on applicants invention.

Rosing, Dr. Mike: Chain Formation in Ferrofluid. Apr. 2007. Paper published on Nanomagnetics.us web site for public circulation. Entire paper relevant to principles of nano-scale magnetite particle action in applicants invention.

Snyder, Michael Monroe: Anti-vortex image in Hele-Shaw cell. Jul. 2011. Article published by the American Physical Society Image database for public circulation. Entire article relevant to operation of applicants invention.

Smith, Damon A. and Stokes, Kevin L.: Discrete dipole approximation for magneto-optical scattering calculations. 2006. Dept. of Physics and Advanced Materials Research Institute, University of New Orleans, New Orleans, La. Paper published by Optical Society of America. Includes mathematical calculations to support applicants claim for Optical Scattering by non-spherical, sub-wavelength nanoparticles.

Rosing, Dr. Mike: Analysis of Superparamagnetic Materials. Mar. 2007. Paper published on Nanomagnetics.us web site for public circulation. Entire paper relevant to principals of nano-scale magnetite particle action in applicants invention.

* cited by examiner

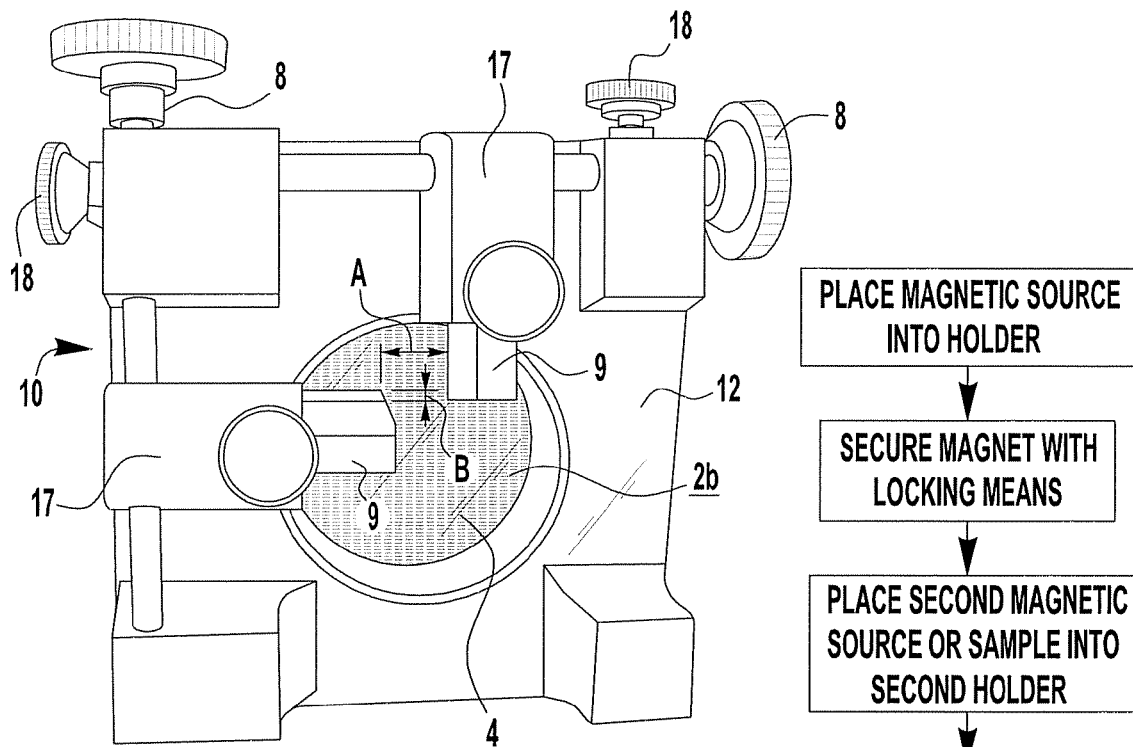
FIG. 3
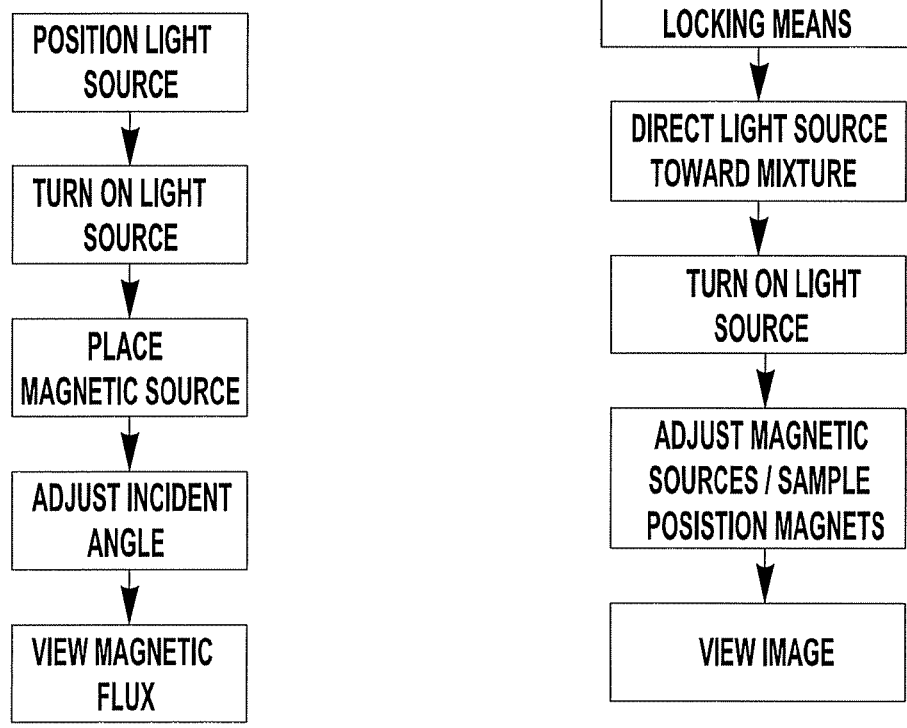
FIG. 4
FIG. 5

MAGNETIC FLUX VIEWER

CLAIM OF PRIORITY

This application claims priority to U.S. Provisional Application No. 60/744,801, filed Apr. 13, 2006, entitled "Magnetic Flux Viewer."

FIELD OF THE INVENTION

The invention relates to a viewing device, and particularly to a device for optically viewing a presentation of magnetic flux that results from the interaction of light, magnetism and matter.

BACKGROUND OF THE INVENTION

Devices for displaying the patterns of magnetic fields are known in the art. However, these devices are often messy and cumbersome to use because they require such features as loose iron filings or flexible plastic films. Additionally, conventional devices show movement of magnetically reactive particles but fail to provide a clear and detailed presentation of magnetic flux. Thus, there is a need in the educational industry for a demonstration device that permits students and others to view a presentation of magnetic flux and optionally, how magnetic flux interacts with other elements of matter.

SUMMARY OF THE INVENTION

The present invention meets this need by providing a magnetic flux viewer that functions independently of such features and that provides an educational demonstration device that enables students and others to visualize magnetic flux and to view the effect of magnetism on non-magnetic matter. In use, a magnetic source is moved in close proximity to ferromagnetic colloidal mixture sealed or positioned between two optically transmissive lenses in the presence of a light source. Optionally, there is a second magnetic source or another element of matter, including non-ferrous matter.

Therefore, it is an object of the present invention to provide a viewer through which an observer looks to view a presentation of magnetic flux.

It is also an object of the present invention to provide a highly defined visual presentation of magnetic flux as a real time image.

It is yet a further object of the present invention to provide a means for viewing the presentation of magnetic flux on a screen.

It is a further object of the present invention to provide a viewer that may be used to study or explore the fundamental properties and principles of magnetism, electromagnetisism, light, and ferromagnetic, diamagnetic, and paramagnetic materials.

It is still a further object of the present invention to provide a viewer that may be used to study or explore properties of matter, waves, or forces.

It is yet another object of the present invention to provide a viewer that may be used to study or demonstrate and compare how ferrous and non-ferrous elements of matter react to magnetism.

It is another object of the present invention to provide a method of using the viewer to view, photograph, and record results collected from the device.

The magnetic flux viewer utilizes the combined properties of a ferromagnetic colloidal mixture, magnetism and the transmission of light to view a presentation of magnetic flux. The magnetic flux viewer comprises a ferromagnetic colloidal mixture positioned between two optically transmissive lenses, the lenses including a means for containing the mixture therebetween. Mixture is comprised of a plurality of magnetically reactive particles. There is at least one magnetic source juxtaposed about the mixture and a visible light source that is positioned to project through the mixture. The interaction of light waves and the mixture creates a visual presentation of magnetic flux. The ferromagnetic colloidal mixture comprises nano-sized magnetite particles coated with a surfactant and suspended in a colloidal mixture that respond to the application of a localized magnetic field thereby aligning themselves in the direction of the magnetic field and forming nano-particle chains. Preferably, the ferromagnetic colloidal mixture is a translucent fluid. When this translucent mixture is contained and placed into a magnetic field, light waves scatter and rotate as they pass through the mixture positioned between the two lenses in regions where the magnetic field has reached its lowest potential. In examples, the viewer also creates a visual presentation of the interaction between magnetic flux and other elements of matter. The claimed magnetic flux viewer makes this Superparamagnetic event visible.

Those and other details, objects, and advantages of the present invention will become better understood or apparent from the following description and drawings showing embodiments thereof.

BRIEF DESCRIPTION OF THE DRAWINGS

FIG. 3 shows a top view of an example of an embodiment of the claimed magnetic flux viewer.

FIG. 4 shows a schematic that outlines the steps of an example of a method of using the claimed magnetic flux viewer.

FIG. 5 shows a schematic that outlines the steps of an example of a method of using the claimed magnetic flux viewer.

DETAILED DESCRIPTION OF EXAMPLES OF THE CLAIMED INVENTION

Figure 1:
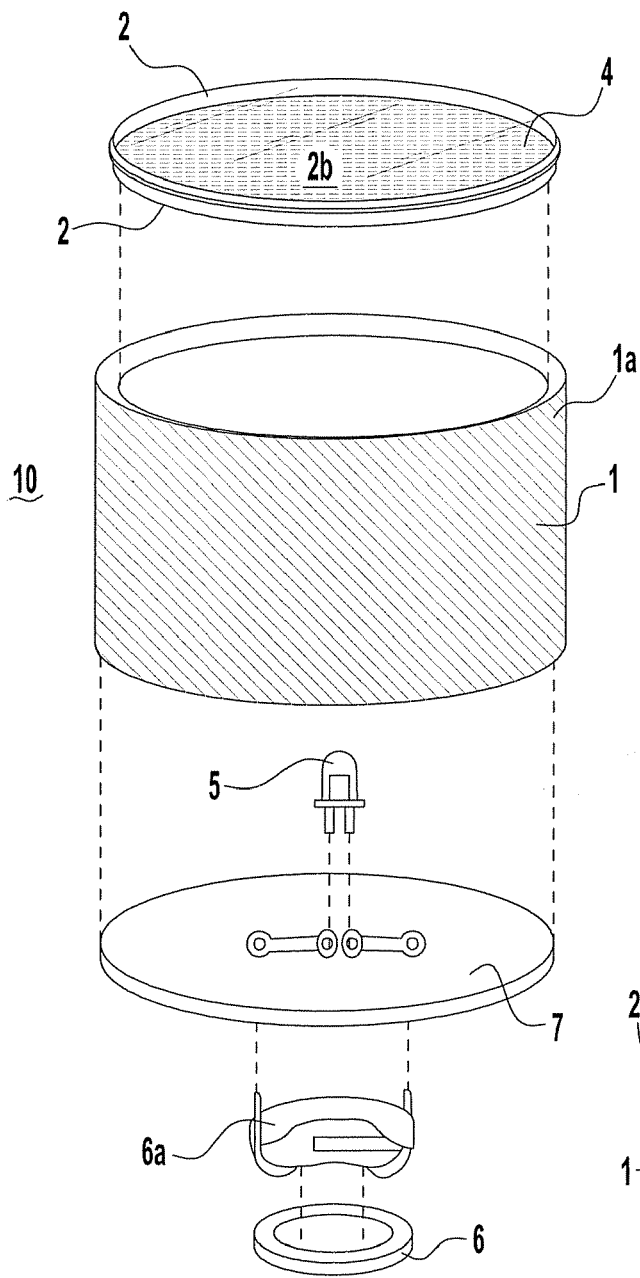
FIG. 1 shows an exploded view of an example of an embodiment of the claimed magnetic flux viewer.

The claimed magnetic flux viewer 10, examples of which are shown in FIGS. 1-3 and 6-8, comprises a ferromagnetic colloidal mixture 4 positioned between two optically transmissive lenses, at least one magnetic source 9, and a visible light source 5. The viewer 10 is used to optically view a presentation of magnetic flux 100 when the magnetic source 9 is juxtaposed about the mixture 4. In an example, the viewer 10 is also used to optically view a presentation of magnetic flux 100 when magnetic source 9 and other elements of matter are placed in magnetic field. In an example, viewer 10 is either portable and is sized to sit on a table top or bench top. In another example, viewer 10 is permanently affixed to a surface such as a table top or bench top. Viewer 10 may optionally comprise a base 12 on which at least one of mixture 4 positioned or sealed between two lenses 2, magnetic source 9, or light source 5 are mounted. Other optional components of viewer 10, described below, are also optionally mounted on base 12. See FIGS. 1, 3, 6-8.

Figure 2:
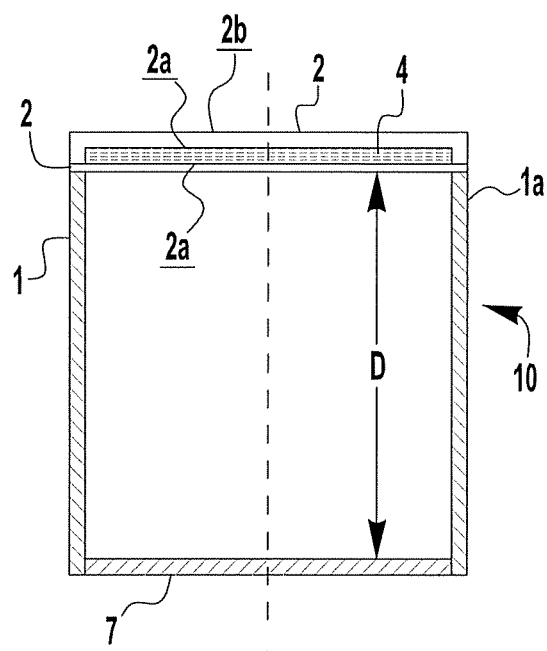
FIG. 2 shows a cross-sectional view of an example of an embodiment of the claimed magnetic flux viewer.

Optically transmissive lenses or transparent members 2 are made from any rigid and optically transparent material, such as for example, glass, including precision ground optic quality glass, and may be any size or shape, including round, square, or rectangular. Diameter or width of lens 2 is not limited to any particular range, but must be large enough for light from light source 5, mixture 4, and magnetic source 9 to interact. Mixture 4, described in more detail below, is positioned between the two lenses 2, the lenses 2 including a means for sealing the mixture 4 therebetween, such as for examples, a substantially air-tight bead of epoxy resin or cyanoacrylate. Lenses or members 2 preferably have substantially equal diameters and have substantially opposed surfaces 2a (see FIG. 2). In an example, each transparent member 2 has a thickness of about 0.10 mm to about 10 mm. Preferably, distance between uncompressed first and second transparent members 2 is about 25 µm to about 175 µm and about 5 µm after members 2 are compressed together (described below), although the distance may be any distance that does not interfere with the purpose of the claimed magnetic flux viewer. Preferably, during manufacture, members 2 are compressed together to remove air from the space therebetween by exerting a downward pressure on members 2, such as a weight ranging from about 1 gram to about 15 kilograms. Preferably, mixture 4 substantially covers opposed surface 2a of each lens 2. Ferromagnetic colloidal mixture 4 is normally opaque and contains a plurality of magnetically reactive particles. In an example, mixture 4 is a mixture commonly known as Ferrofluid that contains magnetite particles that are about 50 times smaller than a wavelength of light when unsaturated by a magnetic field, such as the Ferrofluid manufactured by Ferrotech™ EFH1. In another example, mixture 4 is a fluid that is commonly used to seal magnetic bearing assemblies, such as those found in computer hard drives. As described above, mixture 4 is sealed between two lenses 2. Preferably, mixture 4 comprises nano-sized magnetic particles. Mixture 4 is substantially evenly distributed across surface 2a of each lens 2, as shown in FIG. 2 and as a result becomes translucent. In an example, the volume of fluid 4 ranges from about 0.150 µL to about 2.0 µL, per 25 cm² of the surface area of surface 2a of lens 2.

FIG. 2 shows a cross-section of viewer 10. As shown, two lenses 2 contain mixture 4 therebetween such that mixture 4 is sealed within lenses 2. In the example shown, lenses 2 and mixture 4 contained therein are positioned within an end 1a of housing 1. Circuit board 7 is housed within housing 1 and is positioned a distance D from lenses 2 and mixture 4 therebetween. Preferably, distance D is at least equal to the diameter of lenses 2.

There is at least one magnetic source 9 that is juxtaposed about mixture 4. Magnetic source 9 may be any size or shape, such as for example, square, rectangular, cylindrical or round, as long as the shape does not interfere with the intended function of the magnetic flux viewer 10. In examples such as the ones shown in FIGS. 6A and 6B, magnetic source 9 is at least one magnet, such as for example a neodymium magnet. In another example such as the one shown in FIG. 8, magnetic source 9 is an electromagnetic coil. Preferably, magnetic flux density of magnetic source 9 ranges from about 0.01 Tesla to about 10 Tesla. Optionally, where a magnetic viewer 10 such as the one shown in FIG. 3 is used, a sample of an element of matter contained within a container may be substituted for one of the magnetic sources 9 for the purpose of examining or demonstrating the reaction of the sample to magnetism and light.

Figure 6A:
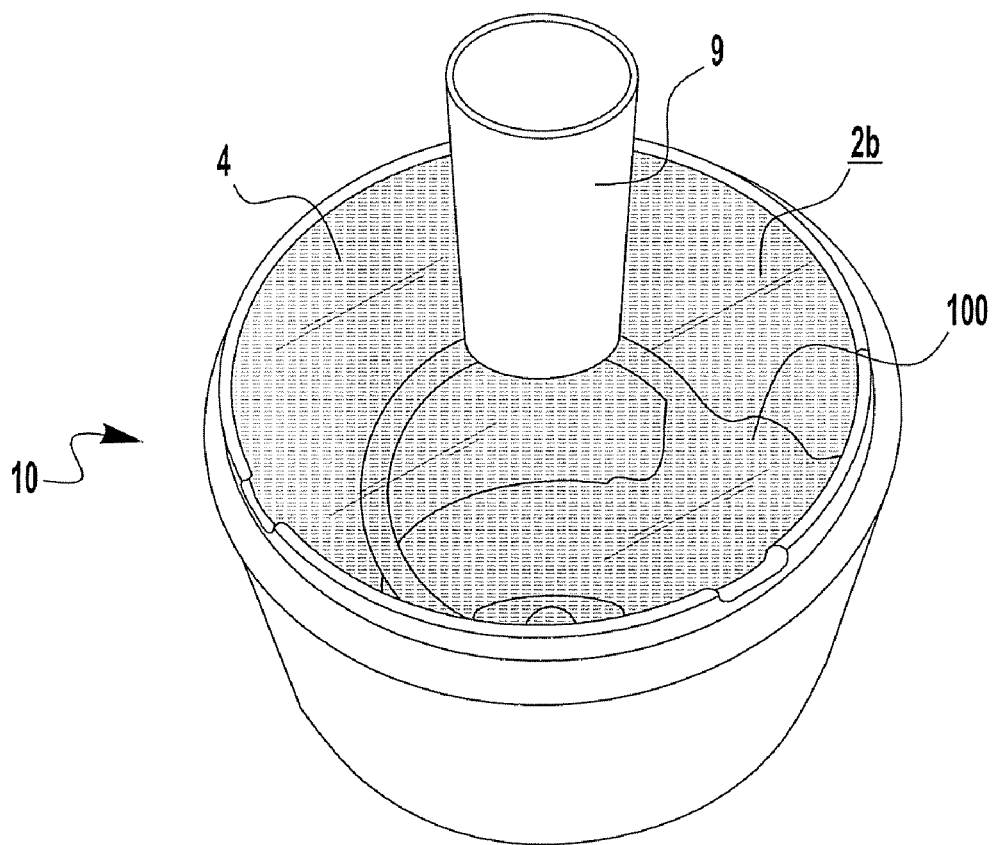
FIG. 6 shows schematics of examples of the presentation of magnetic flux created by the claimed viewer when light, a magnetic source, and the mixture interact.
Figure 6B:
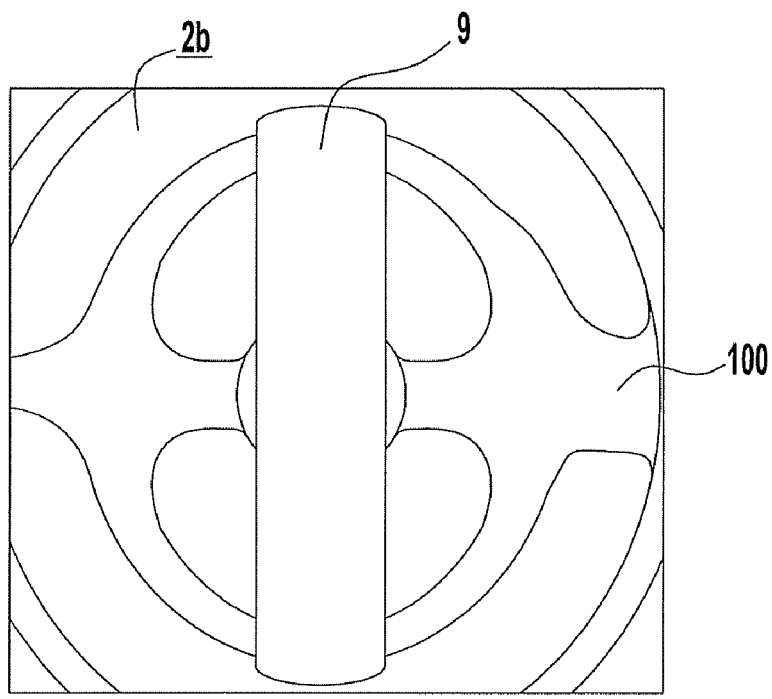
Figure 7:
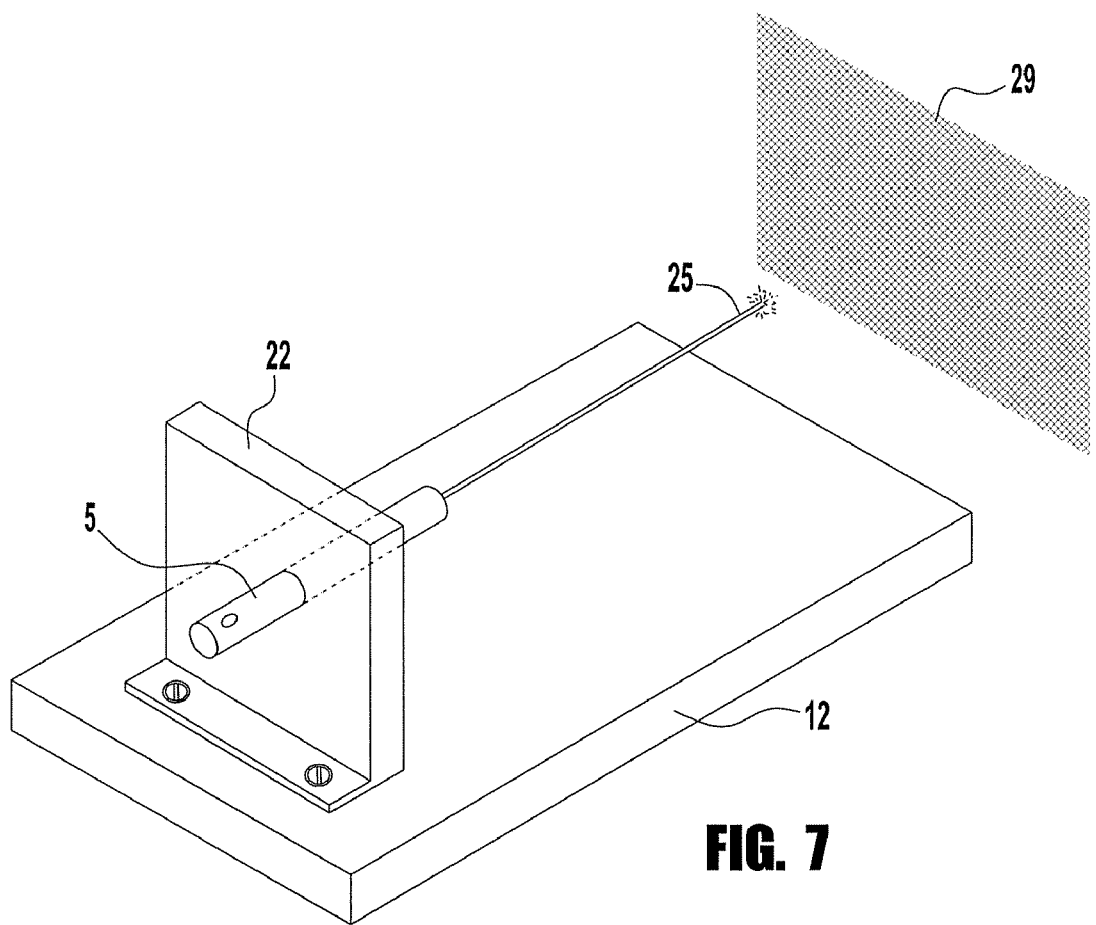
FIG. 7 shows an isometric view of an example of an embodiment of the claimed magnetic flux viewer.
Figure 8:
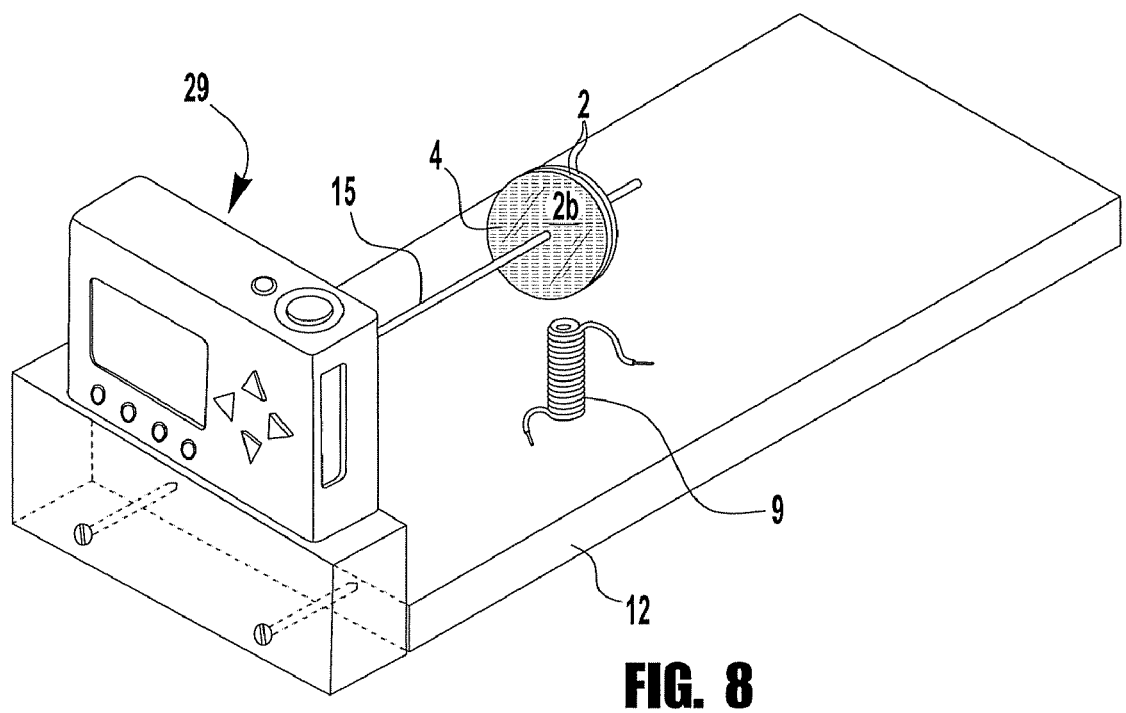
FIG. 8 shows an isometric view of an example of an embodiment of the claimed magnetic flux viewer.

Magnetic viewer 10 also comprises a visible light source 5 that is positioned to project a plurality of light rays 15 through lenses 2 and mixture 4, the light rays 15 of the light source 5 interacting with the mixture 4 to create the presentation of magnetic flux 100 (see FIGS. 6A, 6B). The light source 5 may be either monochromatic or polychromatic, although in an example the light source is white polychromatic light. The wavelength of the light source 5 substantially determines the color of the image seen in the magnetic flux viewer 10. In an example, a red light source shows the presentation of magnetic flux as red. Examples of light source 5 include, but are not limited to, light emitting diode (LED), sunlight, a candle, celestial (i.e., stars, planets), halogen, incandescent light sources, or a laser. The brightness of the image obtained from the magnetic flux viewer 10 is substantially directly related to the intensity of the light source 5. Presentation of magnetic flux is viewed by either looking directly at light source 5 and viewing the presentation of magnetic flux 100 on surface 2b of one of lenses 2 (see FIGS. 6A, 6B). Optionally, presentation 100 is captured by a digital image sensor (FIG. 8) (described below) or is viewed on a viewing surface 29 (see FIG. 7). Preferably, where light source 5 is a high intensity light source (i.e., greater than about 500 lumens), presentation of magnetic flux 100 is projected by light source 5 on to viewing surface 29, such as on a screen (FIG. 7) or digital image sensor (FIG. 8) described below.

In the examples shown in FIGS. 1 and 2, light source 5 is a battery-powered 6 white light emitting diode (LED) that is mounted to a circuit board 7 and secured within housing 1 by battery holder 6a. In an example, the light source 5 is about 1.5 cm away from the magnetic means 9 and the mixture 4 but may be any distance away from the observer. In general, the incident angle of the light source 5 relative to a surface 2b of lens 2 does not substantially affect the quality of the visible image viewed as a presentation of magnetic flux 100. However, an incident angle having a range of about 45° to about 90° from a high intensity light source 5 results in a clearer and brighter image. In examples where light source 5 is a laser, laser is preferably mounted in a bracket 22 such as the one shown in FIG. 7, which is optionally fixed to base plate 12. Laser is positioned so that laser beam 25 is directed toward and through lenses 2 and mixture 4 contained therebetween, preferably with an incident angle relative to surface 2b of about 0°. The presentation of magnetic flux 100 is projected away and distant on to a viewing surface 29 such as the screen shown in FIG. 7 (discussed in greater detail below). Presentation of magnetic flux 100 can be viewed when lower intensity light (i.e., less than 500 lumens), such as a star, planet, our Moon, or a candle, is positioned relative to surface 2b of lens 2 at an angle of about 0°.

Viewer 10 optionally further comprises a viewing surface 29 such as a screen (FIG. 7) onto which the presented image of magnetic flux 100 is projected. Viewing surface 29 may be used with either high or low intensity light sources 5. Where light source 5 is low intensity, viewing surface 29 is either surface 2b of lens 2 or a digital image sensor such as the one shown in FIG. 8, in which the presented image is viewed on a computer monitor screen or is held in a computerized storage device for delayed viewing and analysis. Presentation of magnetic flux 100 may be photographed for future study, viewing, and analysis.

In the examples shown generally in the figures, viewer 10 further comprises a housing 1. Lenses 2 and mixture 4 contained therebetween are housed in housing 1 without obstructing light source 5. Housing 1 is made of a substantially rigid non-ferrous material and is any shape or size that is sufficient to securely house the pair of lenses 2. Housing 1 has a diameter or a width that is substantially the same as that of lenses 2 such that lenses 2 fit snuggly within the housing 1. In examples, lenses 2 are secured within housing 1 by an adherent such as epoxy, resin, or cyanoacrylate, although any securing means that fixedly secures lenses 2 in housing 1 and that does not obscure the presentation of magnetic flux 100 is contemplated to be within the scope of the claimed invention. In the example shown in FIG. 2, lenses 2 are secured within one end 1a of housing 1.

Optionally, as shown in FIG. 3, viewer 10 comprises at least one holder 17 for substantially precise positioning of magnetic source 9 or sample to be analyzed and/or at least one adjuster 8 that positions magnetic source 9 or sample along the X- and Y-axes. Preferably, holder 17 is made of a non-ferrous material such as brass, aluminum or plastic. At least one magnetic source 9 or a magnetic source 9 in combination with a sample to be analyzed are each securely positioned at a substantially 90° angle relative to each other and distances A and B between them are adjusted by adjusters 8. Adjustment is made manually or mechanically, such as by a motorized adjuster. In the example shown, each adjuster 8 is a screw, one of which is manually turned to move along the X-axis and the other of which is manually turned to move along the Y-axis, one of adjusters 8 adjusting distance A and the other adjuster 8 adjusting distance B.

In examples, magnetic source 9 or sample are fixed in holder 17 by a locking means 18 such as the lock screw shown in FIG. 3. Viewer 10 may further comprise at least one support guide (not shown) that stabilizes holder 17 so that holder 17 and consequently magnetic source 9 or sample do not spin as adjuster 8 is rotated.

In another embodiment, the claimed invention is a method of using the magnetic flux viewer 10 to optically view a presentation of magnetic flux 100. A schematic of the steps of the method of use is shown in FIG. 4. In a first step, the visible light source is positioned relative to the magnetic flux viewer. Next, the visible light source is turned on. At least one magnetic source 9 is centered over and juxtaposed about surface 2b of containment means 2, and the presentation of magnetic flux 100 is viewed.

In use, magnetic means 9 is positioned at an angle of incidence relative to surface 2b of at least one of lenses 2, the angle of incidence ranging from about 0° to about 90°. In an example, the method of use further comprises the step of moving magnetic source 9 across surface 2b of at least one lens 2 to show how the presented image responds in substantially direct proportion to the location of magnetic source 9. Optionally, a second magnetic source 9 is moved in close proximity to and away from first magnetic source 9 when magnetic source 9 is substantially centered on surface 2b of lens 2. In this example, the presentation of magnetic flux 100 responds in substantially direct proportion to the strength, angle, distance, and polarity of the two magnetic sources 9 by bending, mingling, and repelling. A viewer such as the one shown in FIG. 3 is useful for such a demonstration.

Optionally, and as outlined in FIG. 5, the method of use of a flux viewer 10 such as the example shown in FIG. 3 further comprises the steps of positioning magnetic sources 9 into the X- and Y-axes holders 17 and securing magnetic sources 9 in place by locking means 18. Magnetic source 9 and/or sample (described below) are adjusted along the X- or Y-axes using adjusters 8. Next, visible light source 5 is positioned relative to surface 2 and mixture 4 therein. As described above, the angle of incidence of light source 5 relative to surface 2b is about 0° to about 45°. The presentation of magnetic flux 100 is either viewed on surface 2b or is projected on to a viewing surface 29. Adjusters 8 are optionally further adjusted to move magnetic sources 9 and/or sample along the X- and Y-axes to thereby alter the presented image in substantially direct proportion to the strength, angle, distance, and polarity of magnetic flux, causing the image on the screen to appear to bend, mingle, and repel. In examples where one of magnetic sources 9 is optionally replaced by a sample of matter (described above), the reaction of matter to magnetism and light can be evaluated.

The magnetic flux viewer 10 operates over a range of ambient temperatures, from about −20° C. to about +85° C. without substantial change in quality of presented image. At temperatures of less than about −20° C., however, there is a delay of about 10 to 30 seconds before the presented image reaches full brightness. The flux viewer 10 requires about 2 to 10 seconds at about room temperature (23° C.) for the presented image 100 to reach full brightness, and at temperatures above about 35° C. there is little, if any, noticeable delay in reaching full brightness.

While the foregoing has been set forth in considerable detail, it is to be understood that the drawings and detailed embodiments are presented for elucidation and not limitation. Design variations, especially in matters of shape, size, and arrangements of parts, may be made but are within the principles of the invention. Those skilled in the art will realize that such changes or modifications of the invention or combinations of elements, variations, equivalents, or improvements therein are still within the scope of the invention as defined in the appended claims.

I claim:

1. A device for optical representation of magnetic flux, said device comprising:
    a) two spaced apart optically transmissive lenses
    b) a ferromagnetic colloidal mixture coextensively positioned in said space between said lenses, said lenses being spaced apart up to about 25 μm; and
    c) a visible light source positioned to project visible light through said mixture to present an optical representation of magnetic flux in the presence of a magnetic source juxtaposed to said mixture.

2. The device as in claim 1, further comprising a housing in which said lenses compressively house said mixture.

3. A device for optically viewing a representation of magnetic flux, comprising:
    a) nonmagnetic housing;
    b) two optically transmissive lenses spaced apart up to about 25 μm;
    c) a transparent ferromagnetic colloidal mixture coextensively compressed between said lenses; and
    d) a visible light source positioned to project light through said mixture to provide an optical representation of magnetic flux when in the presence of a magnetic source.

4. A device for optically viewing a representation of magnetic flux comprising
    a. a housing having a pair of optically transmissive lenses spaced apart from each other up to about 25 μm and
    b. a transparent ferromagnetic colloidal mixture coextensively and compressively positioned between said lenses to optically view a representation of magnetic flux in the presence of at least one magnetic source.

5. A device as set forth in claim 4 including a visible light source.

6. A device as set forth in claim 5 wherein said visible light source is positioned to project visible light through said transparent mixture.

* * * * *